(12) United States Patent
Dietz et al.

(10) Patent No.: US 7,851,326 B2
(45) Date of Patent: Dec. 14, 2010

(54) METHOD FOR PRODUCING DEEP TRENCH STRUCTURES

(75) Inventors: Franz Dietz, Untereisesheim (DE); Volker Dudek, Ettlingen (DE); Michael Graf, Leutenbach (DE); Thomas Hoffmann, Filderstadt (DE)

(73) Assignee: TELEFUNKEN Semiconductors GmbH & Co. KG, Heilbronn (DE)

( * ) Notice: Subject to any disclaimer, the term of this patent is extended or adjusted under 35 U.S.C. 154(b) by 391 days.

(21) Appl. No.: 11/812,386

(22) Filed: Jun. 18, 2007

(65) Prior Publication Data

US 2007/0264792 A1    Nov. 15, 2007

Related U.S. Application Data

(63) Continuation of application No. PCT/EP2005/013359, filed on Dec. 13, 2005.

(30) Foreign Application Priority Data

Dec. 17, 2004   (DE) ................. 10 2004 060 821

(51) Int. Cl.
*H01L 21/76* (2006.01)

(52) U.S. Cl. .............. 438/427; 257/E21.546; 438/424; 438/430

(58) Field of Classification Search ........... 438/424, 438/427, 430; 257/E21.546
See application file for complete search history.

(56) References Cited

U.S. PATENT DOCUMENTS

| 4,472,240 | A | * | 9/1984 | Kameyama |
| 5,536,675 | A | * | 7/1996 | Bohr |
| 6,316,329 | B1 | * | 11/2001 | Hirota et al. |
| 6,476,445 | B1 | * | 11/2002 | Brown et al. |
| 7,235,459 | B2 | * | 6/2007 | Sandhu ............... 438/427 |
| 2003/0030089 | A1 | * | 2/2003 | Sumino et al. |

FOREIGN PATENT DOCUMENTS

EP    1517365 A2 *   9/2004

* cited by examiner

*Primary Examiner*—Matthew C Landau
*Assistant Examiner*—Sonya D McCall-Shepard
(74) *Attorney, Agent, or Firm*—Muncy, Geissler, Olds & Lowe, PLLC

(57) ABSTRACT

A method for producing deep trench structures in an STI structure of a semiconductor substrate is provided, with the following successive process steps: subsequent to a full-area filling of STI recesses introduced into a semiconductor substrate with a first filler material, a first surface of a semiconductor structure is subjected to a CMP process to level the applied filler material and produce the STI structure; the leveled STI structure thus produced is structured; using the structured, leveled STI structure as a hard mask, at least one deep trench is etched in the area of this STI structure to create the deep trench structures.

13 Claims, 5 Drawing Sheets

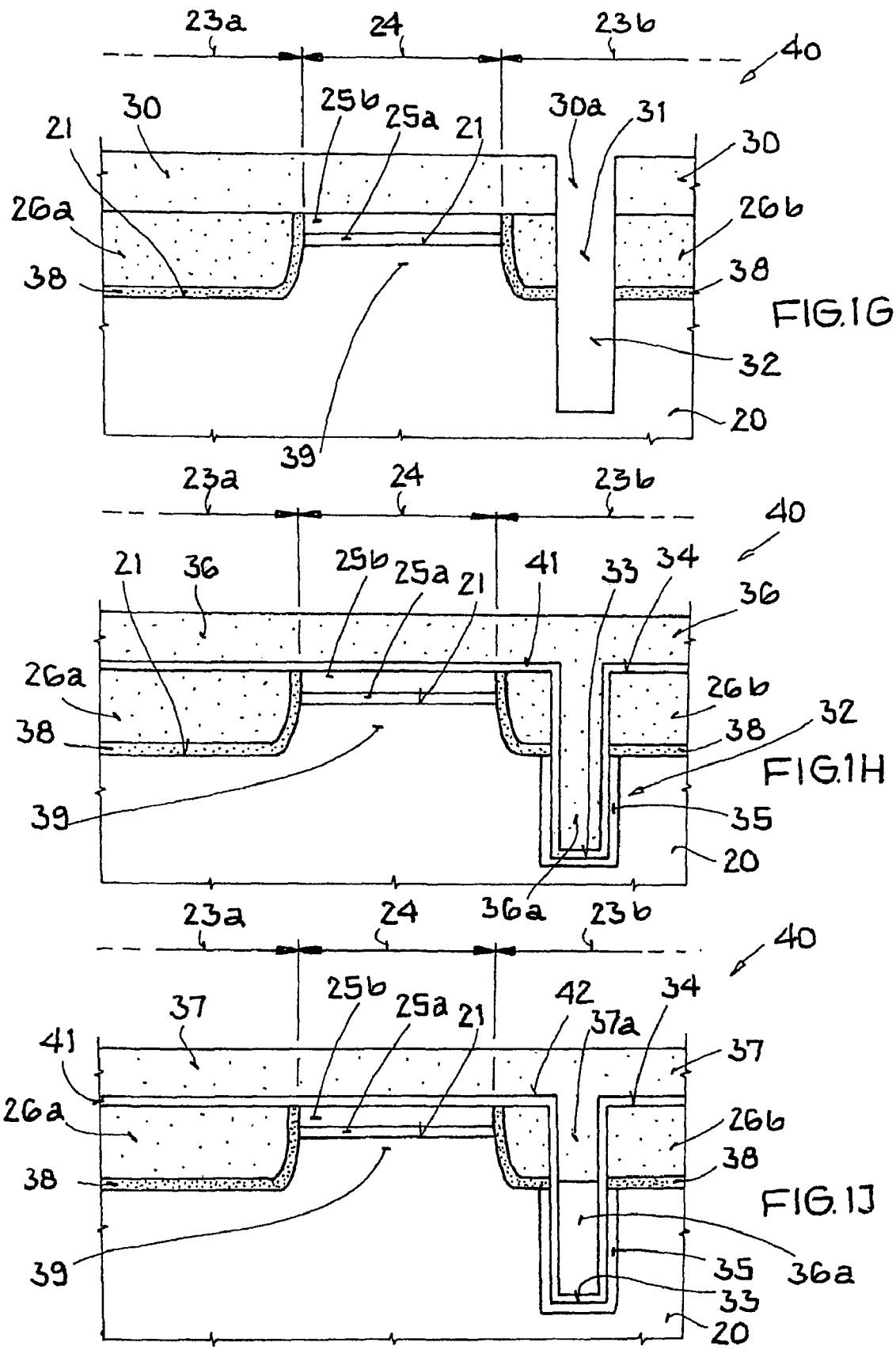

METHOD FOR PRODUCING DEEP TRENCH STRUCTURES

This nonprovisional application is a continuation of International Application No. EP/2005/013359, which was filed on Dec. 13, 2005, which claims priority to German Patent Application No. DE 102004060821, which was filed in Germany on Dec. 17, 2004, and which are both herein incorporated by reference.

BACKGROUND OF THE INVENTION

1. Field of the Invention

The present invention relates to a method for producing deep trench structures in an STI structure of a semiconductor substrate.

2. Description of the Background Art

The increasing integration of highly integrated and very highly integrated semiconductor components is taking on ever greater importance in the development of these semiconductor components. Not least for this reason, the semiconductor components or individual semiconductor structures are increasingly being moved deeper into the semiconductor substrate. This practice requires trenches, for example for lateral insulation of the components.

A method for producing trenches is called the deep trench method (DT=deep trench), in which deep trenches are etched in the semiconductor substrate and preferably filled with a combination of insulating materials and/or polysilicon. Deep trench structures are used in order to electrically insulate semiconductor components from one another that are constructed in adjacent cells of a cell structure. Furthermore, provision can also be made for an insulated electrode to be introduced into a deep trench structure so that the deep trench structure is designed as an electrode, for example as an electrode of a capacitor for a trench capacitor of a semiconductor memory. The depth of these trenches not only minimizes parasitic capacitances between semiconductor components, but also reduces substrate-related interference. Modern deep trench structures achieve aspect ratios of 40 and above; the aspect ratio designates the ratio of a trench's depth to its width.

In addition or as an alternative to these deep trench structures, modern semiconductor components also use shallow trench structures (STI). STI structures are used for such purposes as electrically separating buried conductive traces or substructures of semiconductor components from one another in highly complex semiconductor components. Shallow trench insulation is also used to increase the integration density (known as the packaging density) and to reduce specific component capacitances.

With modern semiconductor components, there is a need to integrate logic elements, which are designed for a relatively low supply voltage, along with power semiconductor components, which are exposed to voltages that are much higher in comparison thereto, together in one semiconductor chip. For this implementation, it is advantageous for the deep trench technology to be combined with the shallow trench technology. In these applications, the deep trench structures are integrated in the areas of the shallow trench structures, so that no additional space requirement results from the use of the two technologies.

A method for creating combined STI structures and deep trench structures is described below with reference to FIG. 2A-FIG. 2E.

FIG. 2A shows a semiconductor substrate 1, which contains two STI regions 2a, 2b, and an active region 3 located between them. In the STI regions 2a, 2b, areas that are intended for an STI structure have been etched out of the surface 4 of the semiconductor substrate 1. The active region 3 has a layer stack 5 for defining a hard mask. A full-area hard mask layer 6 was applied to both the STI region 2a, 2b and the active region 3, and a lacquer mask layer 7 was applied to said hard mask layer 6 (FIG. 2B). The lacquer mask 7 is then appropriately structured in the area of the STI region 2b, and the hard mask 6 is then structured using the lacquer mask 7 (FIG. 2B). The lacquer mask 7 is then removed. Using the window 8a on the hard mask 6, a deep trench 8 is etched in the area of the STI region 2b (FIG. 2C) and is then filled with oxide or polysilicon. This filler material 9 that has been deposited on the surface of the hard mask 6 is then etched back. The removal of the hard mask 6 (FIG. 2D) then follows. Finally, in order to produce the individual STI structures in the area of the STI regions 2a, 2b, the recesses there are filled with an STI filler material 10, for example silicon dioxide (FIG. 2E). This is followed by leveling of the surface of the semiconductor structure, and thus at least partial removal of the layer stack 5, for example by a CMP process.

An idealized method for producing combined STI and deep trench structures has been described using FIGS. 2A-2E. However, the method described there results in several problems that will be discussed briefly below.

During application of the layer stack 5, a step 11 is produced between the active region 3 and the adjacent STI regions 2a, 2b. During the subsequent application of the hard mask 6 and the lacquer mask 7, this step 12 remains in the topography of the lacquer mask 7, with the net result that the surface of the lacquer mask 7 is not flat, but rather has a wavy shape. This is referred to as a vertical, wavy topography of the lacquer mask 7. This wavy topography also results in a varying thickness D3 of the lacquer layer 7, which is to say that D3≠constant. In the semiconductor process, the lacquer mask 7 serves to structure the hard mask 7, which in turn serves to structure the deep trench structures 8. It is problematic here that a vertical topography of the lacquer mask 7 and the hard mask 6 does not permit exact structuring of the semiconductor component and thus exact structuring of the trenches 8 that are to be produced.

The primary problem here is to expose all areas of the lacquer layer 7 homogeneously, which is to say with the same exposure dose, in order to be able to uniformly open the corresponding structures in the lacquer layer 7. However, a differing lacquer layer thickness D3 has the result that different exposure doses are required for the different lacquer layer thicknesses D3. Since this cannot be achieved in practice in the semiconductor process, all areas of the lacquer layer are typically exposed with the maximum exposure dose corresponding to the maximum lacquer layer thickness D3; however, this has the direct result that openings of different widths are produced in the lacquer mask 7. This results in different CD dimensions (CD=critical dimension) for the structures to be exposed. On the whole, this means that, as a result, the process for structuring the lacquer mask 7 and hence for producing the hard mask 6 cannot be precisely controlled, so that trenches 8 of different widths are produced. This is undesirable, particularly when the structures to be produced have very small structure widths for which the CD is relevant.

The vertical wavy topography also results in differing thicknesses D4 of the applied filler material 9 (e.g. polysilicon), which is to say that D4≠constant. This differing thickness D4 of the filler material 9 then continues into the area of the trenches 8. When etching back the filler material 9 from the trenches 8, cavities or voids can be formed in the trenches 8. Cavities or voids are typically unwanted hollow spaces that are formed in processing when the trenches are filled in. Overall, this results in an inhomogeneous filling of the trenches 8, so that the trenches 8 typically lack some or all of the properties (e.g., insulation) that are assigned to them. Inhomogeneous filling of the trenches 8 can also have the result that a different fill height of the filler material remaining in the trenches 8 is achieved when etching back the filler material 9 from the trenches 8. This is also undesirable, since this inhomogeneity of the filling of the trenches 8 must also be taken into account in further processing, with the result that the overall process flow is more complicated and/or that the trench-shaped structures produced thereby are qualitatively worse.

Another problem results when etching back the filler material from the trenches 8. During this back-etching, residue from the filler material can be deposited in the edge region between the STI region 2b and the active region 3. However, it can be very difficult to remove this deposited residue in a later process step. Moreover, during back-etching it is possible for so-called spacers to form; these are also undesirable during the further course of processing.

SUMMARY OF THE INVENTION

It is therefore an object of the present invention to provide a method in which qualitatively better deep trench structures can be created in a simple manner.

In an embodiment, a method for producing deep trench structures in an STI structure of a semiconductor substrate, with the following process steps: subsequent to a full-area filling of STI recesses introduced into the semiconductor substrate with a first filler material, a first surface of a semiconductor structure is subjected to a CMP process to level the applied filler material and produce the STI structure; the leveled STI structure thus produced is structured; using the structured, leveled STI structure as a hard mask, at least one deep trench is etched in the area of this STI structure to create the deep trench structures.

A method for producing deep trench structures in an STI structure of a semiconductor substrate, with the following process steps: a semiconductor substrate having at least one STI recess and at least one active region for a semiconductor component or a part thereof is prepared; full-area application of a first filler material onto the semiconductor substrate, at least in the region of the STI recess, to produce a first filler layer; CMP polishing of a first surface of a semiconductor structure to level the first filler layer that was applied in a full-area manner; structuring of a second surface produced by CMP polishing on the first filler layer to form a hard mask; etching of at least one deep trench using deep trench technology and the hard mask; full-area deposition of a second filler layer to fill the deep trenches; back-etching of excess material of the second filler layer from a third surface of the semiconductor structure and/or the deep trenches.

The discovery underlying the present invention is that reducing the wavy, vertical surface topography for structuring a mask for the deep trench structures is very important in the controlled creation of combined STI structures and deep trench structures. The concept of the present invention is to provide the deep trench structuring and the creation of the deep trench structures at the end of the semiconductor process. The creation of the deep trench structures thus takes place after the STI regions and the active region of the semiconductor substrate have been completed or at least prepared. In particular, the STI structures have already been created or at least prepared by applying an STI filling before the creation of the deep trench structures. A CMP process is performed thereafter.

The particular advantage of this method is that a planar, very flat surface is present for creating the deep trench structures. As a result of this planar, flat surface, the structuring of a mask for creating the deep trench structures is made easier, since there is almost no variation in the layer thicknesses of the mask or hard mask required for creating the deep trench structuring. In other words, the result is that the foundation for the mask required for the deep trench structuring is very precisely predictable, in contrast to the case of a wavy surface topography.

In an embodiment, the STI structure itself, or the filler material of the STI structure, also serves as the hard mask for structuring the deep trench structure. Since the number of process steps required can be reduced in this way, the inventive semiconductor process is also very advantageous from the standpoint of process economy.

The other advantages of the present invention are obvious. Firstly, the requirements on the lithographic processes needed for creating the deep trench structures are less stringent. Due to the leveling of the surface topography by the CMP process, after the creation of the STI structures there are no steps in the area of the surface that could adversely affect a subsequent deep trench structuring. In this way, the deep trench structuring receives a significantly bigger process window, since the allowed focusing range for exposure is expanded as a result of a homogeneous thickness of the lacquer mask. As a result of the essentially flat surface topography, the layer thickness of the filler material for the deep trench structures, and thus for the back-etching as well, is homogeneous in all regions. Moreover, undesirable over-etching is reduced in this way.

Moreover, no unwanted spacers are formed at the edges of the STI structures by residues during back-etching of the filler material introduced into the deep trench structures. Overall, more homogeneous conditions are also produced for back-etching the deep trench filler, resulting in better process control for the back-etching of the filler material introduced into the deep trench structures. In this way, it is also possible to reduce the formation of unwanted cavities (voids) during the covering process that follows back-etching, during which process the trenches and all of the semiconductor structures are covered with a cover layer. This results in improved process control and thus more homogeneous filling of the deep trench structures and a reduced risk of cavity formation.

According to an embodiment of the invention, after a process step, a third filler layer is applied in a full-area manner to the unfilled regions of the deep trenches and to the semiconductor structure.

In another embodiment of the invention, prior to the full-area application of the first filler material to the semiconductor substrate, a layer stack serving to define the active regions and/or serving as an additional hard mask for etching at least one STI recess is applied to a surface of the semiconductor substrate. At the end of the manufacturing process, this layer stack can be removed again, or alternatively, can also be used for passivation and/or for protection of the active regions, for example.

The first filler layer has a first layer thickness in the area of the STI recesses. Preferably, the first layer thickness is dimensioned or set such that, in vertical projection, a first surface on the first filler layer lies at least at the height of the layer stack in the area of the active region. According to an especially preferred and elegant embodiment, the CMP process, which is to say the end of this process step, is controlled by means of this first layer thickness of the STI recesses.

According to an aspect of the invention, an additional thin dielectric layer is arranged between the first filler layer and the semiconductor substrate of the semiconductor structure in the region of the STI structure. This dielectric layer can take the form of thermal oxide, for example, and can serve to improve adhesion of the first filler layer applied thereon, for example.

According to an embodiment, to create the hard mask, a lacquer layer is first applied to the second surface and is structured. Then, using the structured lacquer layer, the STI filler layer is etched completely through in the region of openings in the structured lacquer layer to form additional trenches in the hard mask. Preferably, but not necessarily, the lacquer layer is subsequently removed again from the second surface and the hard mask that is created.

According to another embodiment, an anisotropic etching method is used to etch the deep trenches and/or to etch the STI recesses and/or to create the hard mask. An isotropic etching process is equally possible, although not as advantageous.

In an embodiment, at least one filler layer and/or the layer stack contains a dielectric material. Silicon dioxide, TEOS oxide, and/or silicon nitride are preferred as the dielectric material, but low K, high K, a SOG material (SOG=Spin On Glass), a SOD material (SOD=Spin On Diamond), or the like could also be used here.

In an embodiment, at least one filler layer and/or the layer stack contains an electrically conductive material. For process reasons and on account of its electrical and physical properties, doped polysilicon is preferred as the electrically conductive material; however, a metal, a metallic material, or the like would also be possible here.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIGS. 1A-1J show several schematic partial cross-sections to illustrate the inventive method for producing a semiconductor structure with mixed STI structures and deep trench structures.

DETAILED DESCRIPTION

Figure 1A:
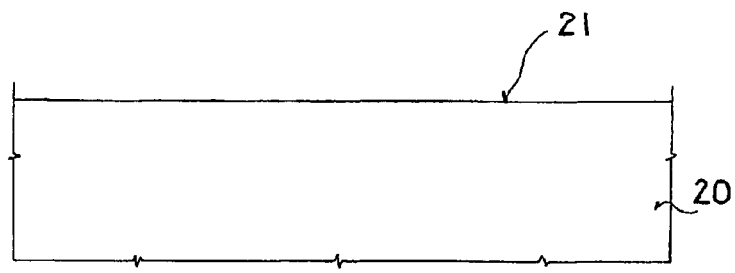
Figure 1B:
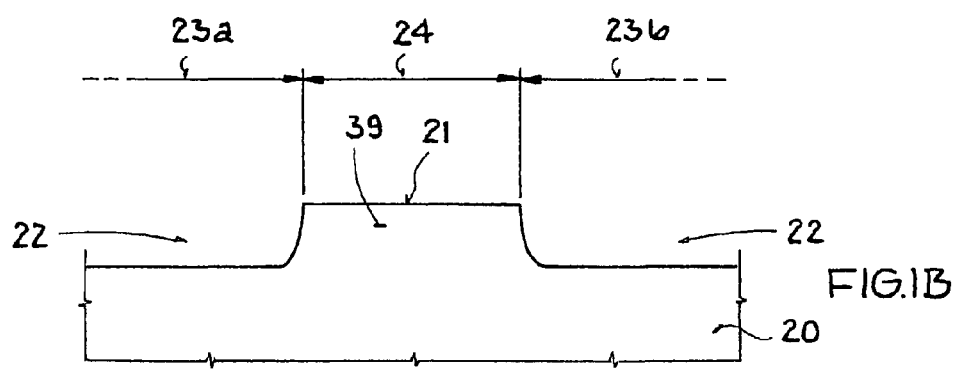
Figure 1C:
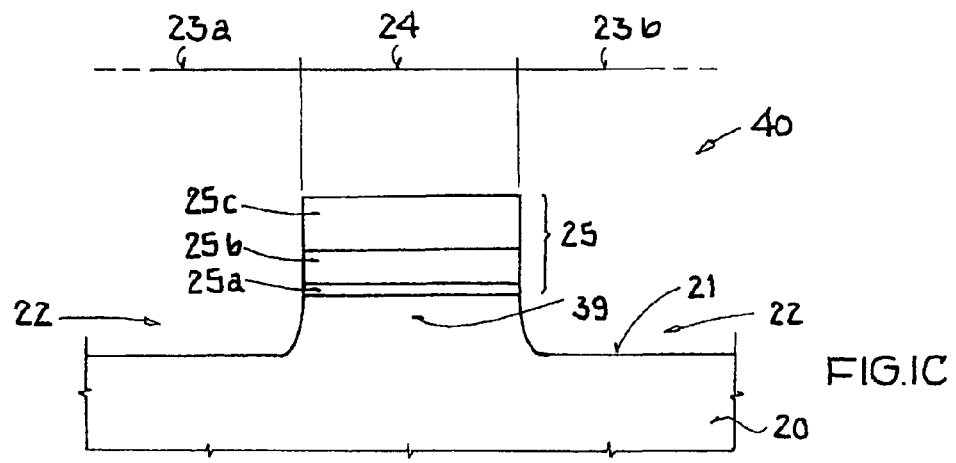

In the drawings, like or functionally like elements and features are identified with the same reference labels, unless otherwise specified.

The invention is explained below by way of example on the basis of the partial cross-sections in the figure sections FIG. 1A-FIG. 1J, wherein the enumerating symbols (A)-(J) below are intended to explain the corresponding figure sections FIG. 1A-FIG. 1J.

(A) A semiconductor substrate 20 is prepared. The semiconductor substrate 20 can be a silicon wafer or part of a silicon wafer, for example, and can contain doped or undoped silicon substrate. The semiconductor substrate 20 has a first surface 21, for example the front side 21 of the wafer.

(B) In a first process step, recesses 22 are created in the first surface 21, for example by wet chemical etching. These recesses 22 are designed as flat, unfilled wells in the present example embodiment. The recesses 22 are separated from one another by a web-shaped (in top view) silicon strip 39. The regions of the recesses 22 define the STI regions 23a, 23b that are to be created later, and the web-shaped silicon substrate located between them defines the active region 24.

It should be noted at this point that the invention is not limited to the particular design of the active region 24, and thus is not limited to the specific implementation of a particular semiconductor component. Rather, any desired semiconductor component, a part thereof, or an entire integrated circuit can be located in the active region 24. In particular, any desired transistor, e.g. a MOSFET, a conductive trace, a semiconductor memory, or a part thereof, can be located in the active region 24, for example. In an advantageous example embodiment, the active region 24 contains a part of a DMOS transistor with a field plate, while the field plate is arranged in the STI regions 23a, 23b, for example.

(C) Next, a layer stack 25 having one or more layers is applied in the area of the active region 24. The layer stack 25 also serves to define the active region 24. Furthermore, the layer stack 25 serves as a hard mask for etching the recesses 22 and thus for defining the STI regions 23a, 23b. In the present example embodiment, it is assumed that the layer stack 25 has a total of three layers 25a-25c; a bottom thin oxide 25a, a silicon nitride layer 25b applied thereon, and a TEOS oxide (TEOS=tetraethoxysilane) layer 25c located above that. This TEOS oxide 25c is an oxide deposition from the liquid phase.

The layer stack 25 and the semiconductor substrate 20 form a semiconductor structure 40, which undergoes further processing below.

(D) Next, the STI regions 23a, 23b are filled with an STI filler material 26a, 26b, for example a TEOS oxide 26a, 26b. This STI filler material 26a, 26b will later constitute the STI filler 26a, 26b of the recesses 22. To this end, the TEOS oxide 26a-26c is deposited on all exposed surfaces of the semiconductor structure 40, i.e. on the surfaces 21 of the semiconductor substrate 20 in the area of the STI regions 23a, 23b as well as on the surface of the layer stack 25 in the area of the active region 24. The deposited TEOS oxide 26a-26c has a layer thickness D1 in the area of the STI regions 23a, 23b that is dimensioned such that it is large enough in the vertical direction that the surface 27 of the layers 26a, 26b in the area of the STI regions 23a, 23b lies at least at the height of the layer stack 25 in the area of the active region 24. Preferably, this surface 27 lies at the height of the TEOS oxide 25c of the layer stack 25.

As a result of the recesses 22 in the area of the STI regions 23a, 23b and/or on account of the layer stack 25, which is raised above the surface 21 of the semiconductor substrate 20, the full-area deposition of the TEOS oxide 26a-26c to form the STI filler layers 26a, 26b results in an uneven, wavy overall surface (topography) that is expressed as a step 28 or a step-like structure 28 between adjacent STI regions 23a, 23b and active regions 24.

Figure 1D:
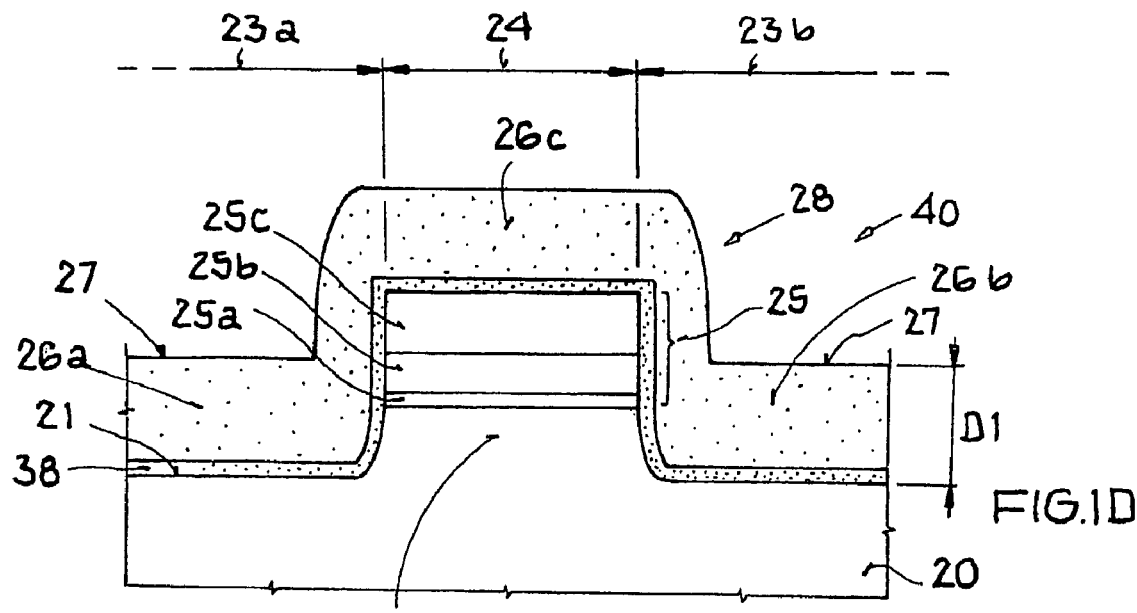
Figure 1E:
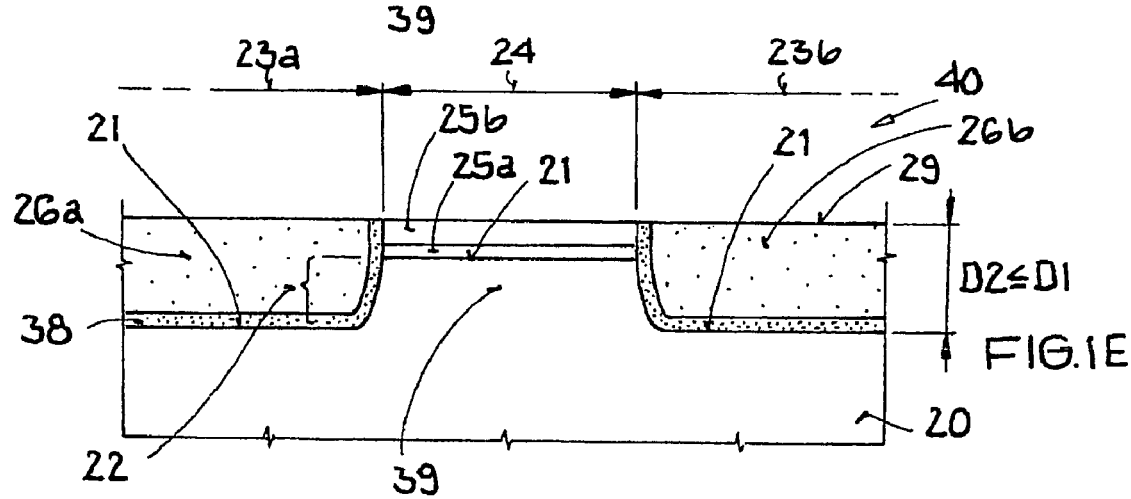
Figure 1F:
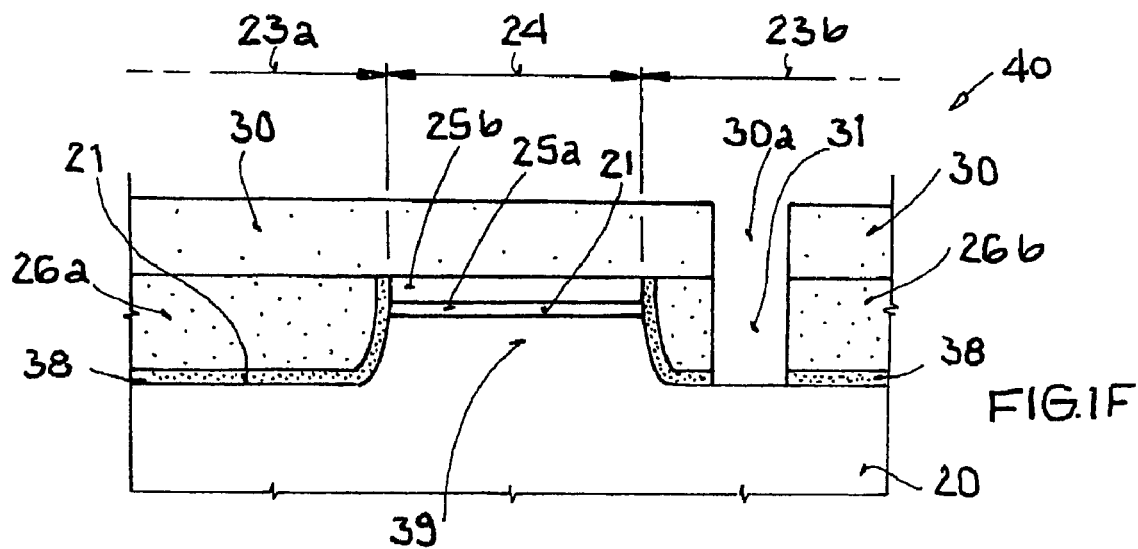
Figure 2A:
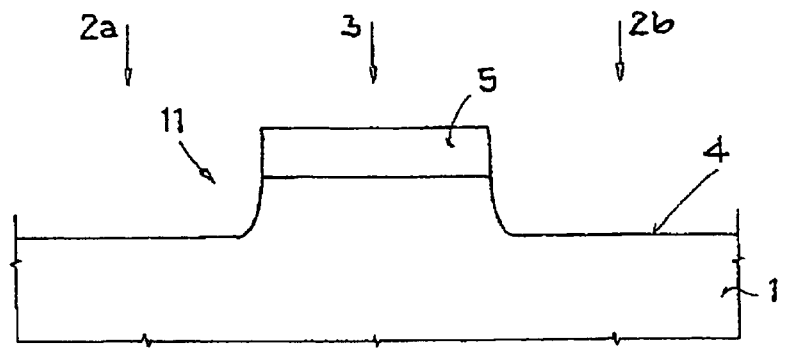
FIGS. 2A-2E show several schematic partial cross-sections of a semiconductor structure for explaining a problem addressed by the present invention.
Figure 2B:
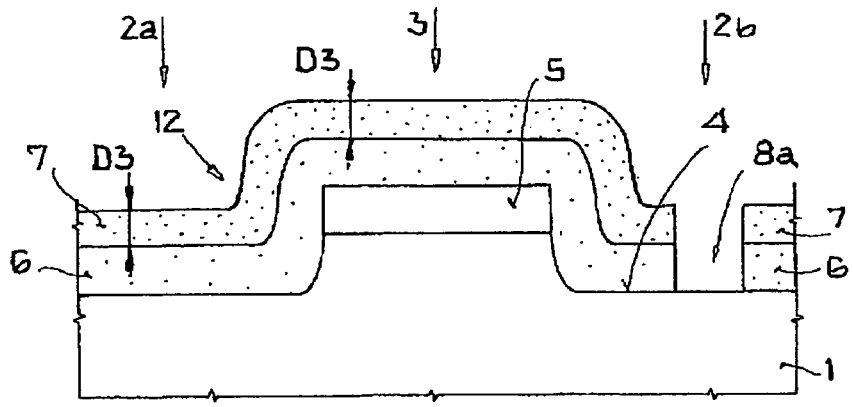
Figure 2C:
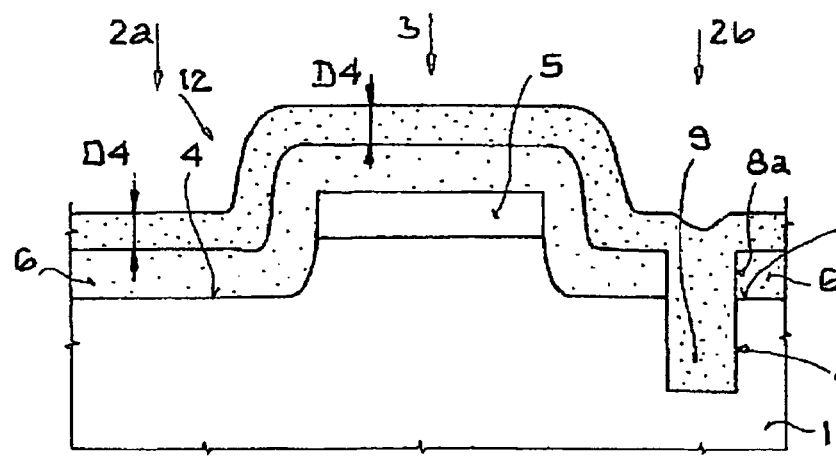
Figure 2D:
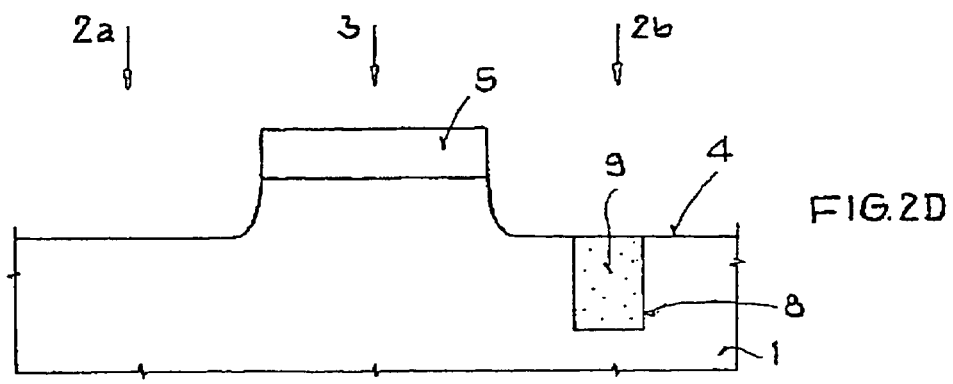
Figure 2E:
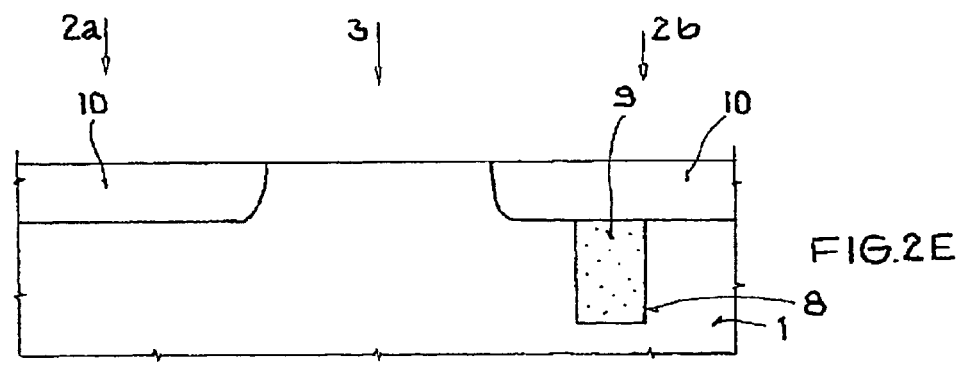

In FIG. 1D, a thin oxide 38, referred to as the liner oxide, is additionally provided below the layers 26a-26c. This oxide 38 is grown by thermal oxidation, for example, on the corresponding surfaces of the semiconductor substrate 20, and provides better adhesion of the TEOS oxide 26a-26c that is subsequently spun on, deposited, or applied in another manner.

(E) Next, the entire semiconductor structure 40 is subjected to a CMP (chemical mechanical polishing) process step. In this CMP process step, the exposed surface of the semiconductor structure 40 is subjected to a polishing process at the end of which the wavy surface topography from FIG. 1D is transformed into a planar, essentially flat surface. Thus in this CMP process, the layers in the area of the active region 24 are removed until an essentially flat, planar surface 29 is produced between STI regions 23a, 23b and active region 24; in other words, the STI regions 23a, 23b are now at the same height as the layer stack 25 in the active regions 24. The end of this CMP process is controlled through, for example, the layer thickness D1 (see FIG. 1D), and thus through the surface 27 of the layers 26a, 26b. In this case, the following relationship applies for the layer thickness D2 in the area of the STI regions 23a, 23b after the CMP process: D2≈D1.

Alternatively, provision can also be made for the layers 26a, 26b to be removed to a small extent by the CMP process. In this case, the following relationship applies for the layer thickness D2 in the area of the STI regions 23a, 23b after the CMP process: D2<D1. The important factor in this case is that a flat surface 29 is produced between the STI regions 23a, 23b and active region 24 at the end of the CMP process, wherein at least a part of the layer stack 25, for example the upper TEOS layer 25c, is removed, and at least a part of the layer stack 25, for example the oxide layer 25a and the nitride layer 25b, remains, essentially as a protective layer on the applicable surface 21 of the semiconductor substrate 20 in the area of the active region 24.

(F) After the CMP process, a lacquer layer 30 is applied to the flat surface 29 produced by the CMP process. The lacquer layer 30 is now structured such that a recess 30a is produced in the lacquer layer 30 in the area of the STI region 23b after exposure and development of the lacquer layer 30. The lacquer layer 30 with the recess 30a now functions as a mask for isotropic or anisotropic etching of the STI filler layer 26b and the thermal oxide 38 located beneath it. After the next etching process, the filler layer 26b has a trench 31 extending through the entire layer 26b and the oxide 38 to the surface 21 of the silicon substrate 20.

(G) Next, the lacquer mask 30 is removed and deep trenches 32 are etched. In this process, the STI filler layers 26a, 26b, and in particular the trench 31 introduced into the STI layer 26b, function as a hard mask for etching the deep trenches 32. At the end of this etching process, deep trenches 32 extending into the semiconductor substrate 20 are formed as an extension of the trenches 31 (the hard mask), wherein the shape of these trenches 32 depends largely on the type and method of the etching process.

In particular, trenches 32 can be produced that are anisotropic, i.e., have largely vertical trench walls. Of course, isotropic etching in which the trench walls are not vertical, or at least are not completely vertical, would also be possible. Bulbous or bottle-shaped trenches 32 would also be possible.

The trenches 32 themselves can be (in top view) round, oval, triangular, square, rectangular, hexagonal, polygonal, strip-like, serpentine, or the like, in shape. Naturally, it would also be possible for the trenches 32 to narrow toward the trench bottom 33. Of course, any other desired shape would also be possible for the trenches 32 arranged in the semiconductor substrate 20.

(H) In the next process step, the trenches 31, 32 are filled in. To this end, a thin, thermal liner oxide 35 is first deposited in a known manner on the exposed surfaces of the trenches 31. In the completed semiconductor component, the liner oxide 35 can then form the gate oxide or gate dielectric, for example. Next, a thin, dielectric layer 41 is applied to all exposed surfaces 34 of the semiconductor substrate 20, i.e. to the walls and bottom 33 of the trenches 32 as well as to the surface 34 of the semiconductor structure 40. This dielectric layer 41 can be designed as a TEOS layer 41, for example.

Next, the trenches 31, 32 are filled in with a filler material 36, 36a, for example with doped polysilicon 36, 36a. In order to ensure a defined filling-in of the trenches 31, 32, a full-area deposition of polysilicon 36, 36a on the semiconductor structure 40 is carried out here, with the polysilicon being deposited in the trenches 32, 31 as well as on the surface 34.

In the completed semiconductor component, the polysilicon 36a in the trenches 32 can function as gate electrodes, for example. Naturally, instead of polysilicon, another conductive material can also be used, for example a metal or metallic material. Filling with a dielectric would also be possible, for example TEOS, low K, high K, silicon dioxide, silicon nitride, etc., if the trench 32 is intended to be used to insulate adjacent cells.

(J) Next, excess polysilicon 36 is etched away. To this end, the polysilicon 36 is also removed from the thin oxide 41 on the surface 34. Moreover, the polysilicon is also etched back in the area of the trenches 31 in the area of the STI filler layer 26b. At the end of this etching process, the polysilicon filler layer 36a is located only in the area of the trenches 32, which is to say the rest of the polysilicon has been completely etched away from the trenches 31 in the STI filler layer 26b.

Following this etching process, a TEOS layer 37, 37a is applied in a full-area manner to the exposed surfaces 42 of the semiconductor structure 40, which is to say both to the trenches 31 in the area of the STI filler layer 26b, and to the exposed surface 42.

Customary process steps, for example back-etching of the STI filler, an additional CMP process, e.g. for reducing dishing effects, and the like, can be undertaken after these process steps (A)-(J). In particular, other process steps can then also be carried out to produce or complete appropriate semiconductor components in areas of the active region 24. Depending on the semiconductor components or integrated circuits that are to be created, these steps must be matched specifically to those components and integrated circuits, and thus are not described further here.

In an alternative process flow that differs from the example embodiment in FIG. 1A-FIG. 1J, no STI filler is applied before deep trench etching (see FIG. 1G). Instead, an additional layer (e.g., a TEOS layer) is applied first; this layer functions separately as a hard mask for the deep trench etching. Following deep trench etching and filling of the etched deep trenches, the STI filling for the STI recesses can then be produced as described above. While this embodiment requires an additional process for producing a separate hard mask, this may be advantageous or even required in the rest of the process.

In a further alternative, an additional hard mask layer (e.g., a TEOS layer) is applied for the STI recesses in addition to the applied STI filler. Consequently, the deep trench etching does not need to be selective to the surfaces exposed following the CMP process. After structuring to define the deep trench regions, the additionally applied hard mask layer is etched to create the hard mask. The deep trench etching is then performed in a known manner. If necessary, a separate etching of the STI filler layer can also be carried out before or after creation of the deep trenches.

Applications for the two insulation techniques described above (STI and deep trench technologies) include, for example, intelligent automobile applications in which "smart ICs" are used, which is to say intelligent semiconductor components driven by logic circuits. Another application is RF transceiver circuits in which a receiver and a transmitter are located on the same semiconductor chip, and preferably support full-duplex operation, which is to say the simultaneous transmission and reception of signals. STI and deep trench technologies were developed in this context primarily in order to reduce parasitic capacitances in "cross-talk" situations to a sufficient degree to permit full-duplex operation, which is to say the simultaneous transmission and reception of signals through the same semiconductor chip.

Although the present invention was described above using a preferred example embodiment, it is not limited thereto, but rather can be modified in a variety of ways.

Thus, the present invention is not limited to the aforementioned materials for the deposited layers, filler layers and layer sequences, which were specified merely as an aid to understanding. Instead, other additional layers can also be used here, or else intermediate layers can also be omitted when this is useful.

Nor is the inventive method necessarily limited to the very detailed method described above. Rather, this represents a preferred method, but not the only method to be used; naturally, this method can be suitably modified within the scope of the invention and the knowledge of one skilled in the art without departing from the inventive concept of the present invention.

In the inventive method described, a thermal processing step can be carried out in each case after trench filling, after application of the TEOS layer, after application of the layer stack, etc., in order to reduce the number of structure defects in the dielectric within the trenches created by the deep trench structure. The avoidance of void inclusions in particular is intended in this regard. In addition, the thermal process results in a subsequent flow of the dielectric that leads overall to a more planar dielectric, when as this is desirable and the temperature is set accordingly.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for producing deep trench structures in an STI structure of a semiconductor substrate, the method comprising:
   providing at least one STI recess into a respective at least one portion of said semiconductor substrate;
   providing materials to form an active region on a second portion of said semiconductor substrate;
   introducing a first filler material to provide full-area filling of each of said at least one STI recess and to cover said active region to form a semiconductor structure;
   subjecting a first surface of said semiconductor structure to a CMP process to level said first filler material and produce the STI structure, wherein the STI structure is a level planar surface across the entirety of the full-area filling and the active region; and
   etching at least one deep trench, using the leveled STI structure as a hard mask, in an area of the STI structure to create the deep trench structures.

2. A method for producing deep trench structures in an STI structure of a semiconductor substrate, the method comprising:
   a) preparing a semiconductor substrate having at least one STI recess and at least one active region for a semiconductor component or a part thereof;
   b) full-area application of a first filler material on the semiconductor substrate, including the active region and in the region of the at least one STI recess, to produce a first filler layer and form a semiconductor structure;
   c) CMP polishing of a first surface of said semiconductor structure to level the first filler layer that was applied in a full-area manner and to provide a level planar surface across the entirety of the filler layer and the active region of said semiconductor structure;
   d) structuring of a second surface produced by CMP polishing on the first filler layer to form a hard mask;
   e) etching of at least one deep trench using deep trench technology and the hard mask;
   f) full-area deposition of a second filler layer to fill the deep trenches;
   g) back-etching of excess material of the second filler layer from a third surface of the semiconductor structure and/or the deep trenches.

3. The method according to claim 2, wherein, after the process step (g), a third filler layer is applied in a full-area manner to the unfilled regions of the deep trenches and to the semiconductor structure.

4. The method according to claim 2, wherein, prior to the full-area application of the first filler material to the semiconductor substrate, a layer stack serving to define the active region and/or serving as an additional hard mask for etching at least one STI recess is applied to a surface of the semiconductor substrate.

5. The method according to claim 2, wherein the deposited first filler layer in the area of the STI recesses has a first layer thickness that is at least large enough that, in vertical projection, a first surface of the first filler layer is provided at least at a height of the layer stack in an area of the active region.

6. The method according to claim 2, wherein an additional thin dielectric layer is arranged between the first filler layer and the semiconductor substrate of the semiconductor structure in a region of the STI structure.

7. The method according to claim 2, wherein, to create the hard mask, a lacquer layer is first applied to the second surface and is structured, and wherein, using the structured lacquer layer, the STI filler layer is etched completely through in a region of openings in the structured lacquer layer to form additional trenches in the hard mask.

8. The method according to claim 2, wherein an anisotropic etching method is used to etch the deep trenches and/or to create the hard mask and/or to etch the STI recesses.

9. The method according to claim 2, wherein the first filler layer and/or the second filler layer and/or the third filler layer and/or the layer stack has a dielectric material.

10. The method according to claim 2, wherein the first filler layer and/or the second filler layer and/or the third filler layer and/or the layer stack has an electrically conductive material.

11. The method according to claim 2, wherein the first filler layer and/or the second filler layer and/or the third filler layer and/or the layer stack has doped polysilicon.

12. The method according to claim 5, wherein the CMP process is controlled by the first layer thickness.

13. The method according to claim 9, wherein silicon dioxide and/or TEOS oxide and/or silicon nitride is provided as the dielectric material.

* * * * *